United States Patent [19]

Senderowicz

[11] Patent Number: 4,599,573

[45] Date of Patent: Jul. 8, 1986

[54] SWITCHED CAPACITOR FILTER UTILIZING A DIFFERENTIAL INPUT AND OUTPUT CIRCUIT AND METHOD

[75] Inventor: Daniel Senderowicz, Berkeley, Calif.

[73] Assignee: Intel Corporation, Santa Clara, Calif.

[21] Appl. No.: 738,397

[22] Filed: May 28, 1985

Related U.S. Application Data

[62] Division of Ser. No. 311,144, Oct. 13, 1981, Pat. No. 4,574,250.

[51] Int. Cl.[4] .............................................. H03F 1/14
[52] U.S. Cl. ...................................... 330/107; 330/9; 330/51; 330/252
[58] Field of Search ...................... 330/9, 51, 86, 107, 330/109, 252, 282

[56] References Cited

U.S. PATENT DOCUMENTS 4,453,130  6/1984  Bennett ........................... 330/107 X

OTHER PUBLICATIONS

Jacobs, G. M., "Practical Design Considerations for MOS Switched Capacitor Ladder Filters", UCB-ERL, Nov. 11, 1977.

Gregorian, R., "Filtering Techniques W/Switched-Capacitor Circuits", *Microelectronics Journal*, vol. 11, No. 2, 1980, pp. 13-20.

*Primary Examiner*—Eugene R. LaRoche
*Assistant Examiner*—Steven J. Mottola
*Attorney, Agent, or Firm*—Blakely, Sokoloff, Taylor & Zafman

[57] ABSTRACT

An integrated circuit employing a differential amplifier and switched capacitor networks to provide filtering techniques. The differential amplifier utilizes a feedback circuit between its inputs and outputs. A switched capacitor network coupled to the inputs of the amplifier and a second switched capacitor network coupled to the outputs of the amplifier provide the requisite filtering necessary for analog-to-digital encoding or digital-to-analog decoding. The differential configuration allows for less noise and better power supply rejection, whereby allowing for a higher signal-to-noise ratio.

3 Claims, 14 Drawing Figures

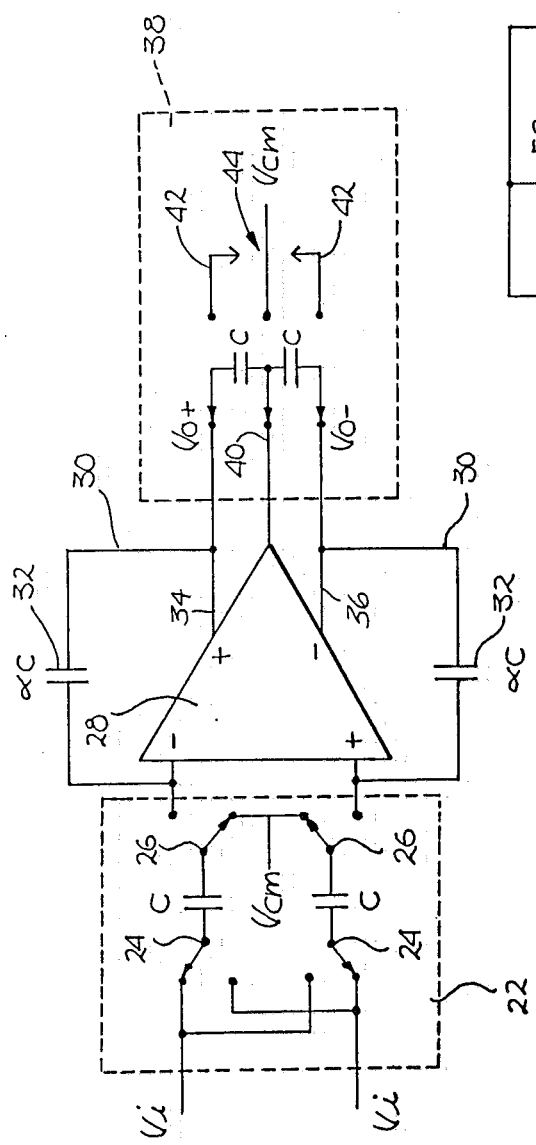
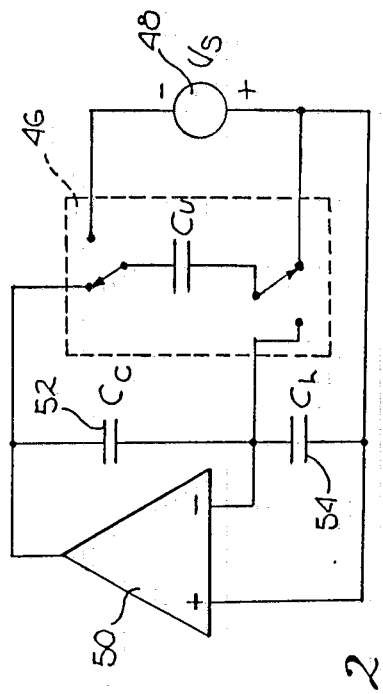
Fig. 1
Fig. 2

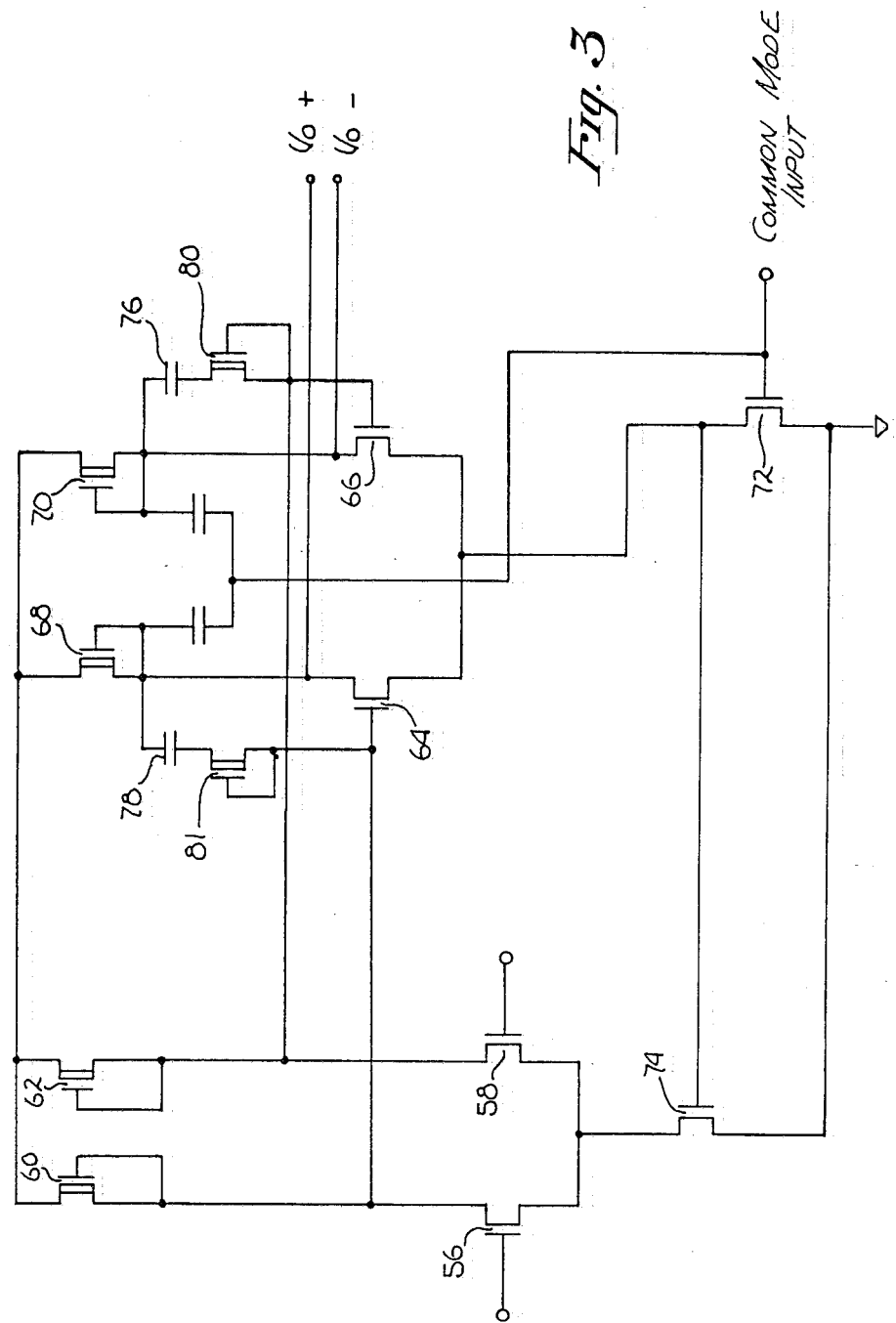

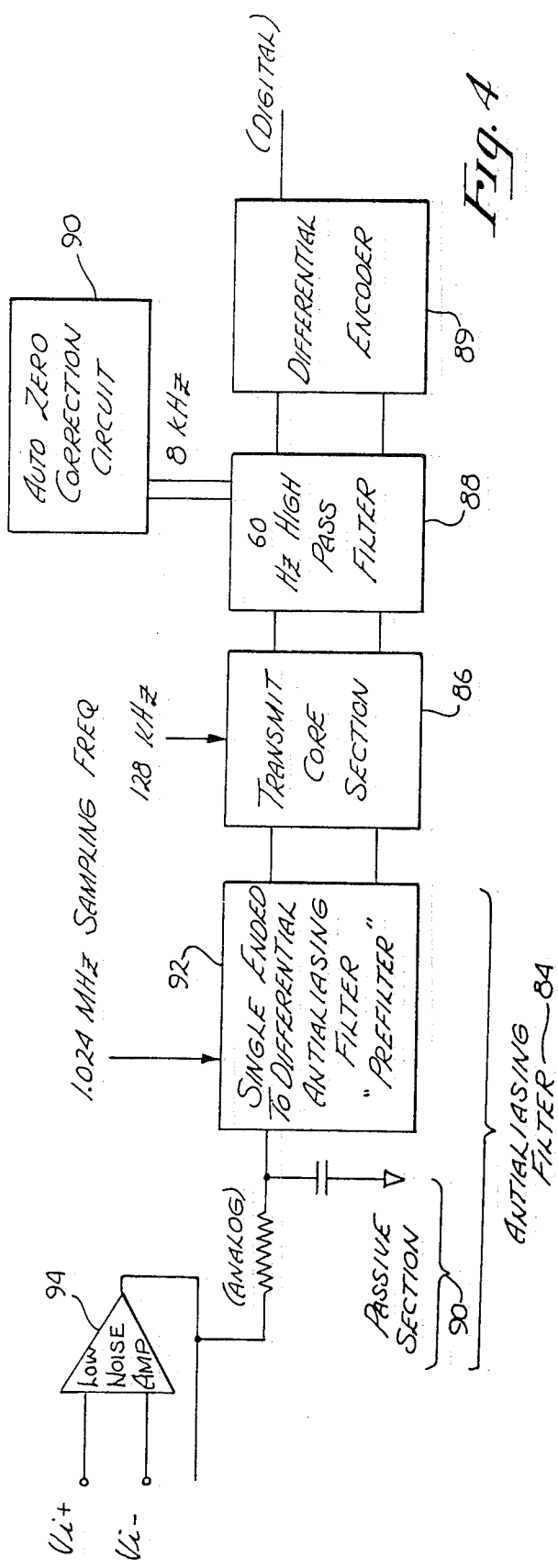
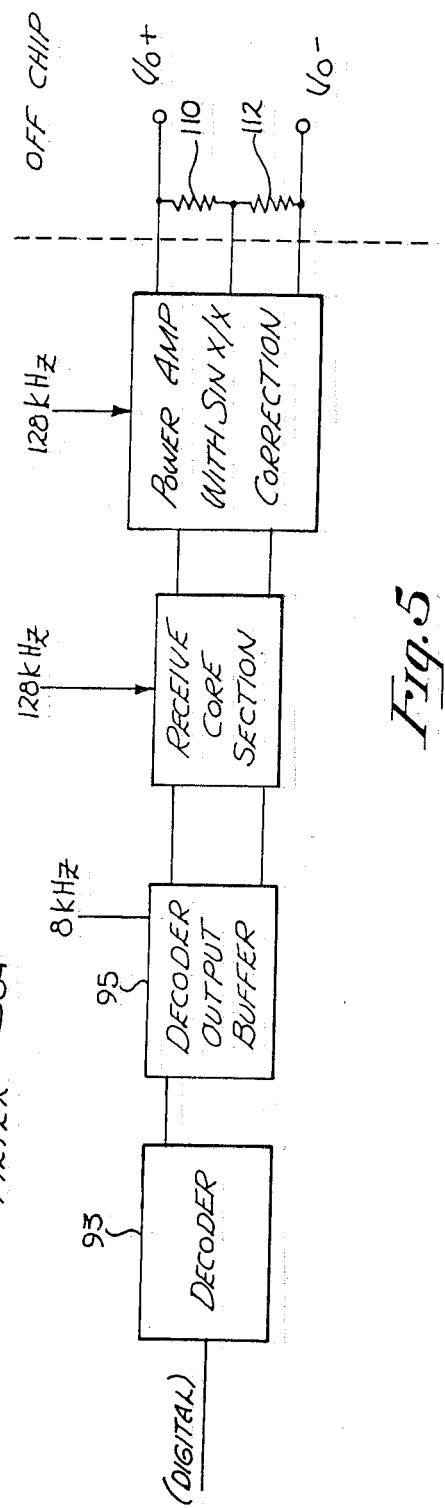

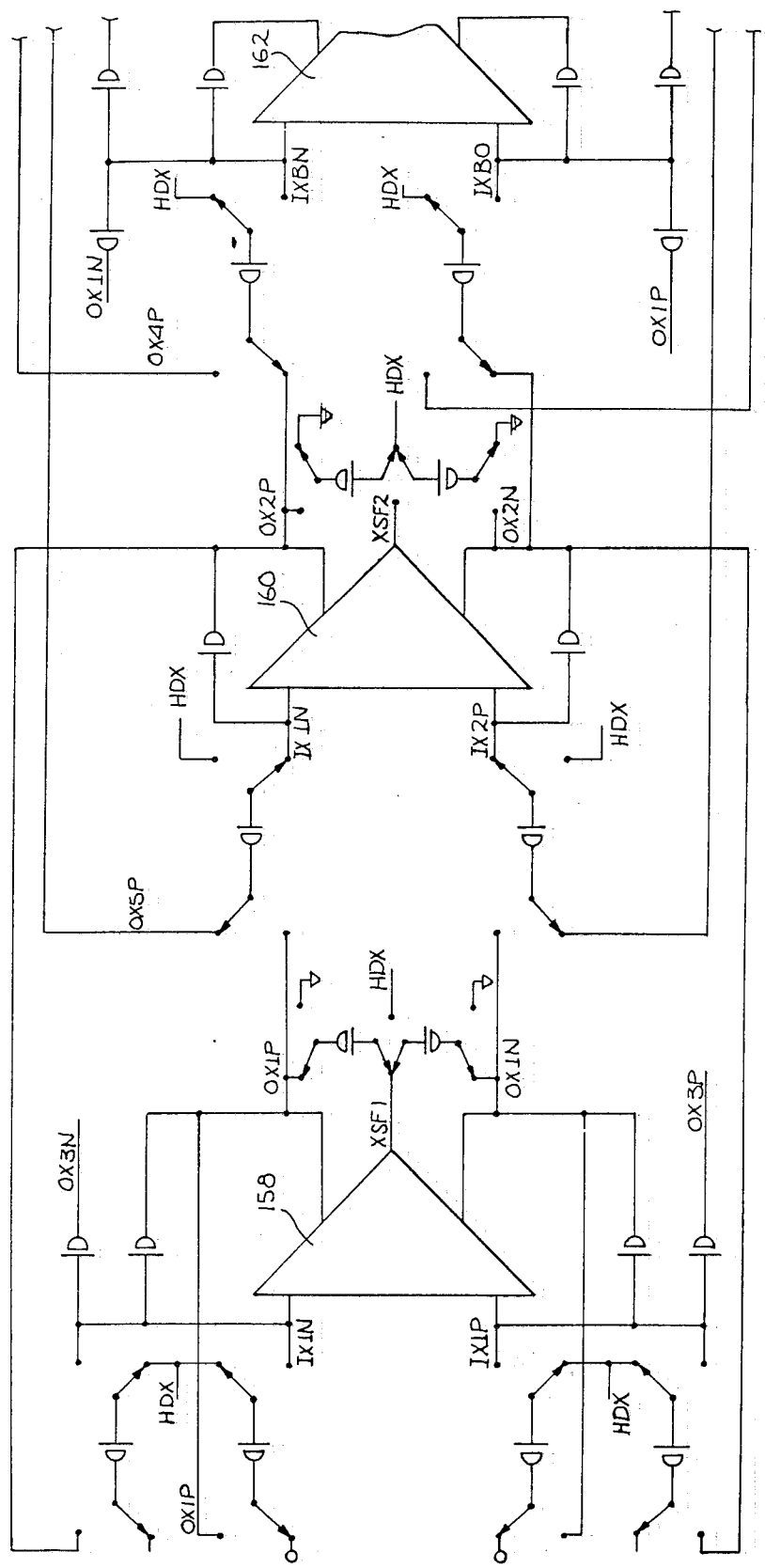

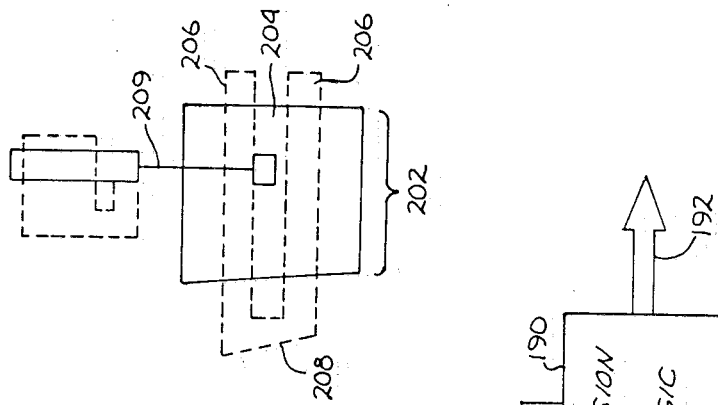
Fig. 13
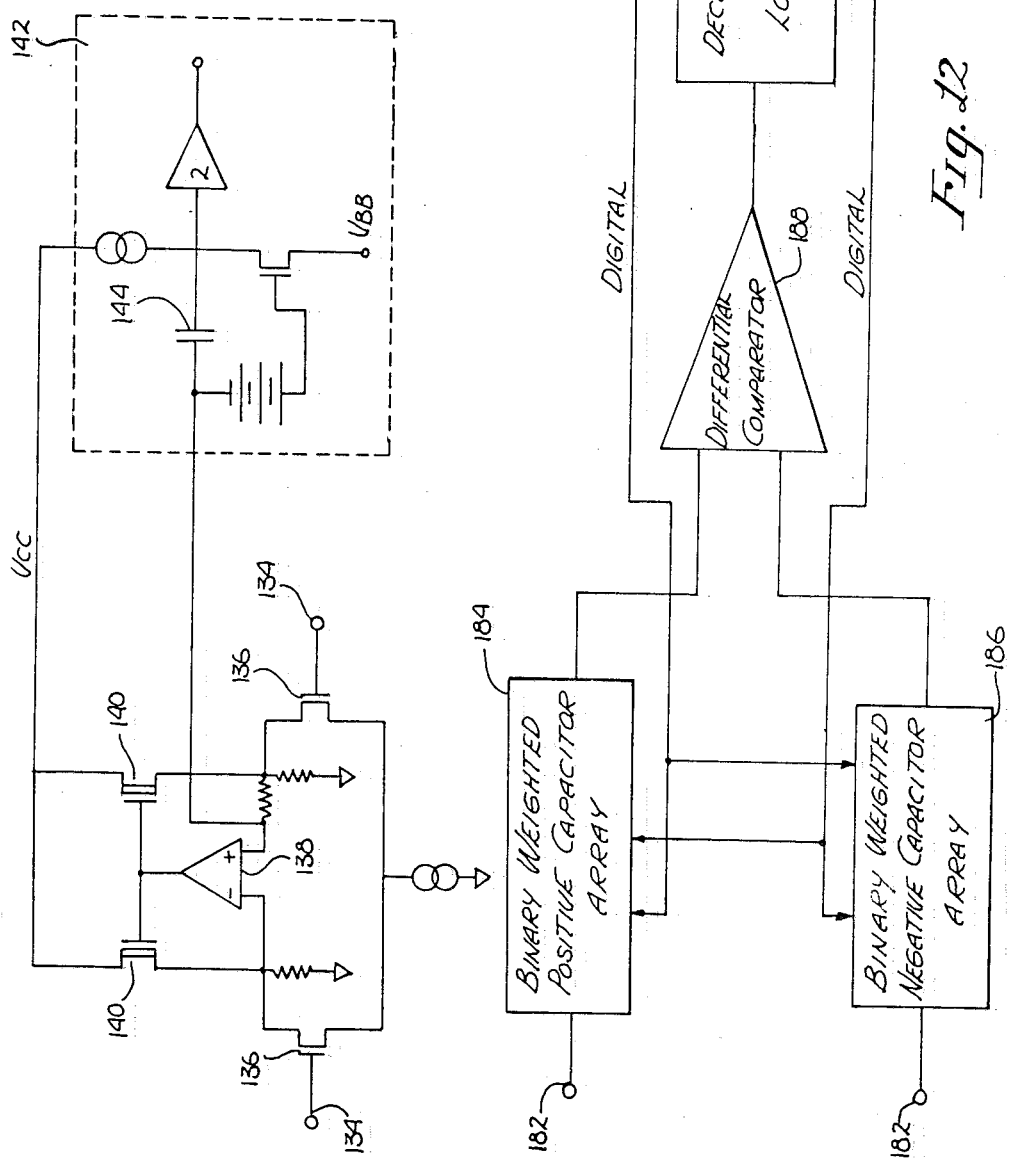
Fig. 11
Fig. 12

SWITCHED CAPACITOR FILTER UTILIZING A DIFFERENTIAL INPUT AND OUTPUT CIRCUIT AND METHOD

This is a divisional of application Ser. No. 311,144 filed Oct. 13, 1981, U.S. Pat. No. 4,574,250, issued Mar. 4, 1986.

BACKGROUND OF THE INVENTION

1. Field of the Invention

The invention relates to the field of analog integrated filters and filtering methods, particularly filters utilizing switched capacitor techniques.

2. Prior Art

Substantial amounts of effort have been expended in the development of circuitry and methods for the digitization of analog information for digital transmission. In order to achieve high quality audio application in analog-to-digital encoders and decoders, voiceband filters are required which must meet among other stringent requirements, stringent signal-to-noise ratios and power supply rejection. Degradation of monolithic filter performance has been a particular problem. In an integrated filter, the amount of power dissipation, supply rejection and signal-to-noise ratio is appreciably different than the amounts experienced in circuits comprised of passive or discrete active elements. In addition, integrated filters are subject to chip area limitations. However, in order to devise an economical and effective device in digital communications, it is indispensable that a circuit design and methodology, operable within the design limitations of an integrated circuit, be realized.

What is needed then is a circuit and method by which a combination of filter and analog-to-digital encoder, and of filter and digital-to-analog decoder can be devised in an integrated circuit to meet the stringent requirements with respect to noise and power supply rejection imposed upon the circuit by voice transmission standards and still meet the power dissipation and chip area limitations inherent in integrated circuit design.

BRIEF SUMMARY OF THE INVENTION

The invention is a differential amplifier, having internal common mode feedback and correction between a first stage of the differential amplifier and a second stage of the differential amplifier. The differential amplifier is used as a switched capacitor integrator in a switched capacitor filter in combination with an encoder and decoder which is fully differential throughout the circuit.

In particular, the invention is a circuit comprised of a differential signal path in an amplifier having a balanced differential output, a balanced common mode feedback and a common mode signal path. The amplifier in question is the active element in the switched capacitor integrator. The amplifier includes a cascade of two differential amplifiers, each with active loads and a common mode feedback path between the second of the two cascaded differential amplifiers and the first of the two cascaded differential amplifiers.

The integrated circuit includes a transmit side and receive side. The transmit side in turn comprises a third order elliptic antialiasing filter which includes a passive filter section. A fifth order elliptic transmit core filter is coupled to the antialiasing filter and a high pass filter is coupled to the transmit core filter. Each of the filter sections have their sampling frequencies in decreasing magnitude from input to output. For example, the antialiasing filter is over-sampled at a first rate, equal to 1.025 Mhz. The transmit core filter is sampled at a second rate, 128 Khz. The high pass filter is then sampled at a third rate, 8 Khz. The first rate is such that the passive RC section provides enough filtering to avoid aliasing into the passband. The cutoff frequency of the combined antialias filter (passive section and biquad) is such that no aliasing distortion will appear in the transmit side clocked at 128 Khz and the transmit side provides band limiting for the highpass which is clocked at 8 Khz. The receive side of the filter comprises a digital to analog decoder, a decoder output buffer coupled to the digital to analog decoder, and a fifth order caller receive core filter coupled to the buffer. A power amplifier is coupled to the receive core filter. The post filter/power amplifier has a gain setting capability which is independent of frequency and has the sin x/x correction.

These and other advantages and aspects of the invention can be better understood by viewing the following figures in connection with the detailed description of the preferred embodiments.

BRIEF DESCRIPTION OF THE DRAWINGS

FIG. 1 is a simplified schematic diagram of the switched capacitor, differential integrator of the invention upon which the circuitry of the filter is based.

FIG. 2 is a block diagram showing the common mode amplifier model of the switched capacitor integrator.

FIG. 3 is a detailed schematic of the amplifier for the switched capacitor integrator.

FIG. 4 is a block diagram showing the overall architecture of the transmit side of the filter encoder combination.

FIG. 5 is a block diagram showing the overall architecture of the receive side of the filter decoder.

FIG. 10b is a more detailed schematic of the operational amplifier shown in FIG. 10a.

FIG. 11 is a schematic showing the structure of the low noise amplifier.

FIG. 12 is a block schematic showing the structure of the encoder.

FIG. 13 is a plan view of the chip surface illustrating the stacked-in-unit concept to lay out the devices in the chip.

DETAILED DESCRIPTION OF THE PREFERRED EMBODIMENT

Figure 6A:
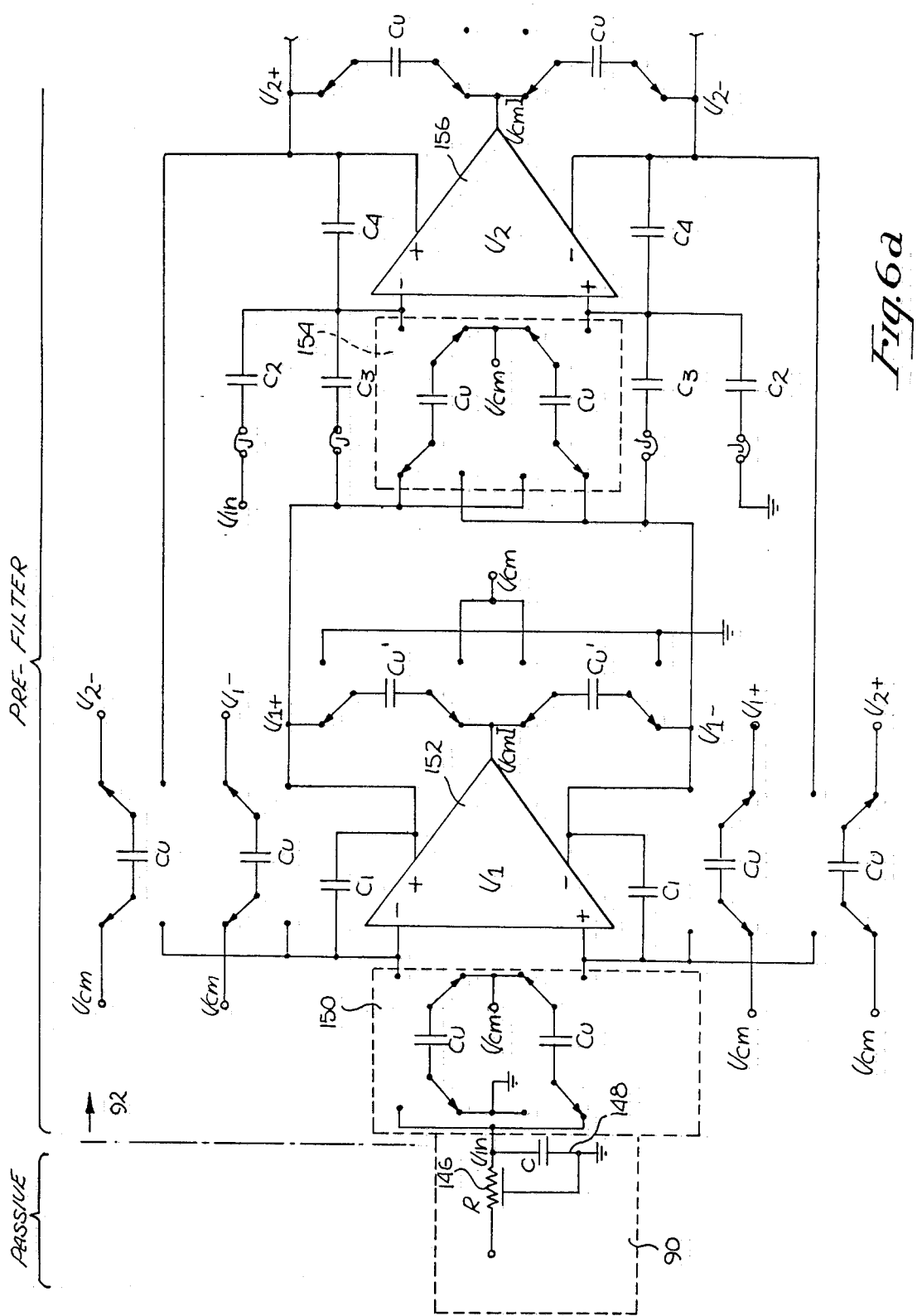
FIG. 6 is a detailed schematic showing the circuitry of the anti-aliasing filter.

Better signal to noise ratio and power supply rejection can be achieved in an integrated PCM codec/filter chip with acceptable power dissipation and an acceptable amount of chip area by utilizing throughout the analog-to-digital encoder and digital-to-analog decoder filter a consistent differential treatment of the analog signal. The basic element of the filter circuit and method is a balanced output differential integrator. Power supply variations and coherent noise which are additive to the input and output of any stage within the circuitry are not actually avoided but are cancelled by subtraction of the differential outputs at each stage. The manner in which this arises from the design of the differential integrator can be better understood by considering the operation of the differential integrator as illustrated in FIG. 1. The manner in which this basic building block can be modified and applied in a filter architecture is then described in greater detail beginning with FIG. 3 and following.

The operation of the differential integrator is based upon a balanced output amplifier and is similar to the circuit as illustrated in FIG. 1. The differential integrator in FIG. 1 is illustrated as having a switched capacitor input 22 with input terminals VI+ and VI−. Differential switched capacitor integrators are well-known to the art, an example of which is discussed by K. Hsieh and Paul Gray, "A Low Noise Chopper Stabilized Differential Switched Capacitor Filtering Technique", Joint Services Electronics Program Contract F49620-79-C-0178 and National Science Foundation Grant NG79-07055. The difference between the input voltages VI+ and VI− is the total input voltage, VI, while the average of each of these inputs is zero. A balanced switched capacitor sampler 22 is shown diagramatically in FIG. 1 as being comprised of two capacitors having an equal capacitance and switched at the input side by a switch 24 and at the output side by a switch 26. The output of switch 26 is coupled to the input of an amplifier 28 which has balanced feedback loops 30 which include a pair of capacitors 32 of equal capacitance. The capacitance of capacitor 32 is ratioed to the capacitance of switched sampler 22. The output of operational amplifier 28 is comprised of a positive voltage output 34, VO+, and a negative voltage output 36, VO−. Outputs 34 and 36 are similarly coupled to a switched capacitor sampler 38 which serves as a common mode feedback, again showed diagramatically as two equal capacitances switched between the outputs 34 and 36, a center input 40, and grounded terminals 42 and a center signal terminal 44. The result of sampler 38 is to keep the average value of the two outputs 34 and 36 equal to zero without affecting the output voltage VO which is equal to VO+ − VO−.

It is easiest to analyze the operation of the circuit of FIG. 1 as being comprised of two circuits, namely a differential signal filter circuit and a common mode filter circuit. Common mode signal is that voltage which would be on both terminals as opposed to the differential signal which only appears on the difference of the input and output terminals. Typically, clock noise and power supply variatons are common mode signals. It can be shown that the differential signal transfer function is:

$$H_d(Z) = \frac{C}{a_C} \cdot \frac{1 + Z^{-1}}{1 - Z^{-1}}$$

where K is a constant, and Z is a complex variable.

The differential switched capacitor integrator shown has the advantage of being insensitive to parasitic effects. The simplicity of the structure of FIG. 1 is particularly attractive for realizing filters of higher order, especially when direct simulation of a passive ladder is sought. The exploitation of these advantages is better shown in FIG. 6 in regard to the anti-alias filter and in FIG. 8 with regard to the 60 Hz highpass section.

When considering the common mode filter circuit, the circuit of FIG. 1 can be diagrammatically represented as shown in FIG. 2. In other words, the circuit appears as if it were a circuit having a switched capacitor sampler 46 of value $C_u$ into which the common mode voltage signal, Vs, 48 is coupled. One of the switched inputs is then coupled to the negative input of an operational amplifier 50 while the positive input is considered as ground or the common potential. The output of operational amplifier 50 is fed back through an integrating capacitor of value, $C_c$. A load capacitance, $C_L$, exists across the input of operational amplifier 50. It can be shown that the transfer function for the common mode configuration is:

$$H_c(Z) = \frac{(1 + C_u/C_c)(1 - Z^{-1})}{(1 + C_l + C_L/C_c)(A_c)(1 - Z^{-1}) + \left(1 + \frac{1}{A_c}\right) \frac{C_u}{C_c}}$$

where $A_c$ is the common mode gain.

Therefore, it can be seen that the common mode circuit has an infinite attenuation at d.c. frequencies and behaves as a highpass filter with the 3 dB point at approximately $C_U F_s / C_c$, where $F_s$ is the sampling frequency at which the switched capacitors are driven. Therefore, it can be readily appreciated that even at rather modest sampling frequencies, the common mode attenuation is small. However, this does not pose any problem as the output of the integrator is always sampled differentially throughout the filter circuit. In the ideal case, power supply rejection is theoretically infinite and only departs therefrom according to the nonidealities of the integrator.

In addition to having theoretically infinite, common mode rejection, the balanced differential integrator has a significant noise advantage as compared to a single ended integrator. Assume that the switched capacitor size and the differential output integrator and the integrating capacitor were halved so that the differential integrator consumes as much capacitor area as a single ended integrator. To a first order of approximation, the switched capacitors contribute thermal noise which is equal to the equivalent of its resistor noise. Therefore, doubling the noise sources would double the noise power. However, at the same time the differential output has twice the voltage swing so that the signal power is quadrupled. Therefore, an additional 3 db of dynamic range is attained by using the differential integrator with an equal amount of capacitance. Furthermore, the integrator does not require any differential to single ended converters or level shifters thereby reducing overall power required in the filter circuit.

By paying careful consideration to the layout plan, as described below, the greater chip area required for a differential amplifier by duplication of the capacitors and associated bussing connections was minimized. In the layout, each core section was treated as a block so that the core amplifiers, integrating capacitors, switched capacitors and their interconnections could be optimized to consume the minimum possible area.

The circuit configuration for the operational amplifier is shown in detail in FIG. 3. The basic amplifier is used in each of the filter sections which will be described below and is modified according to the application in each section. Basically, the amplifier is composed of a cascade of two differential amplifiers which are source coupled pairs cascaded to give a nominal gain of 2000 for the differential signal. The amplifier has an internal feedback scheme for common mode correction of the first stage.

The first stage of the operational amplifier is comprised of differential amplifiers 56 and 58 with their corresponding active loads, 60 and 62 respectively. The second stage is comprised of differential amplifiers 64 and 66 in combination with active loads 68 and 70 respectively. The differential inputs are the gates of devices 56 and 58. Capacitive coupling from the outputs of the second stage of the amplifier to the gate of device 72 form part of the common mode feedback correction loop for the output voltage. Devices 64 and 66 are also coupled as source followers to device 74 which acts as a common source amplifier. Device pair 56 and 58 act as a cascade isolator together with their active load devices 60 and 62. The input common mode feedback loop is completed through the outputs of the first stage to devices 64 and 66. Device 72 forms a common mode amplifier in a common source configuration which is cascaded by device pairs 64 and 66 with active loads 68 and 70. Internal compensation is achieved through capacitances 76 and 78 which are coupled to active loads 70 and 68 respectively in series with resistive elements 80 and 82 respectively. The output of the amplifier is taken from devices 64 and 66 in the second stage.

It can now be understood how the basic amplifier described in FIGS. 1-3 can be employed in a filter circuit to achieve the objects recited above. Consider, for example, the architecture of the transmit side of the filter-encoder combination as shown in FIG. 4, and the receive side of the filter decoder combination as shown in FIG. 5. FIG. 4 illustrates the overall architecture which is functionally similar to the Intel combination 2912/2911 chip set, trademarked integrated circuits sold by Intel Corp., of Santa Clara, Calif., but is markedly different in implementation. The transmit side is comprised of three sections: an anti-aliasing filter section 84, a transmit core section 86, and a highpass filter section 88, a differential encoder 89, and auto-zero circuit 90.

Anti-aliasing filter section 84 is comprised of two stages: (1) a first passive section 90; and (2) a single ended-to-differential converter and an oversampled prefilter 92. The input signal must be band limited before sampled. Passive section 90 acts as a first order filter with an attenuation of 32 dB or greater above 1 MHz. The single ended output of passive section 90 is converted to a differential signal by means of a switched capacitor scheme and coupled to differential, oversampled filter 92. Amplifier 94 is a low noise, high gain operational amplifier which can be set by the user in any feedback configuration. Prefilter 92 will be discussed in greater detail in connection with FIG. 6, and amplifier 94 in FIG. 10.

Transmit core section 86 is a fifth order elliptic lowpass filter. Filter section 86 uses a two-phase lossless digital integrator (LDI) clocked with a sampling frequency of 128 kHz. The details of transmit core section filter 86 are described in connection with FIG. 7 where it can be seen that the transmission zeroes were realized simply by considering the proper phase inversion acquired at any stage. In addition, the terminations are complex conjugates of each other in a sampling sense to give lower sensitivities.

The cutoff point for transmit core section filter 86 is approximately 3.4 kHz. The sampling frequency in the 60 Hz highpass section 88 coupled to transmit section 86 is 8 kHz. No additional aliasing components are introduced by this sampling frequency. 60 Hz highpass section 88 is a switched capacitor representation of a third order highpass filter and is shown and described in greater detail in connection with the circuitry of FIG. 8. Functionally, highpass section 88 is a simulation of a resistively terminated $L_C$ filter. This provides 27 dB of attenuation at 60 Hz and 32 dB at 50 Hz. Inasmuch as highpass section 88 is capacitively coupled to transmit section 86 no voltage offset is propagated through highpass section 88. Feedthrough problems which arise by virtue of the different sampling rates between sections 86 and 88 are handled by the inclusion of additional gates at the interface between the two sections as included within highpass section 88.

Figure 9:
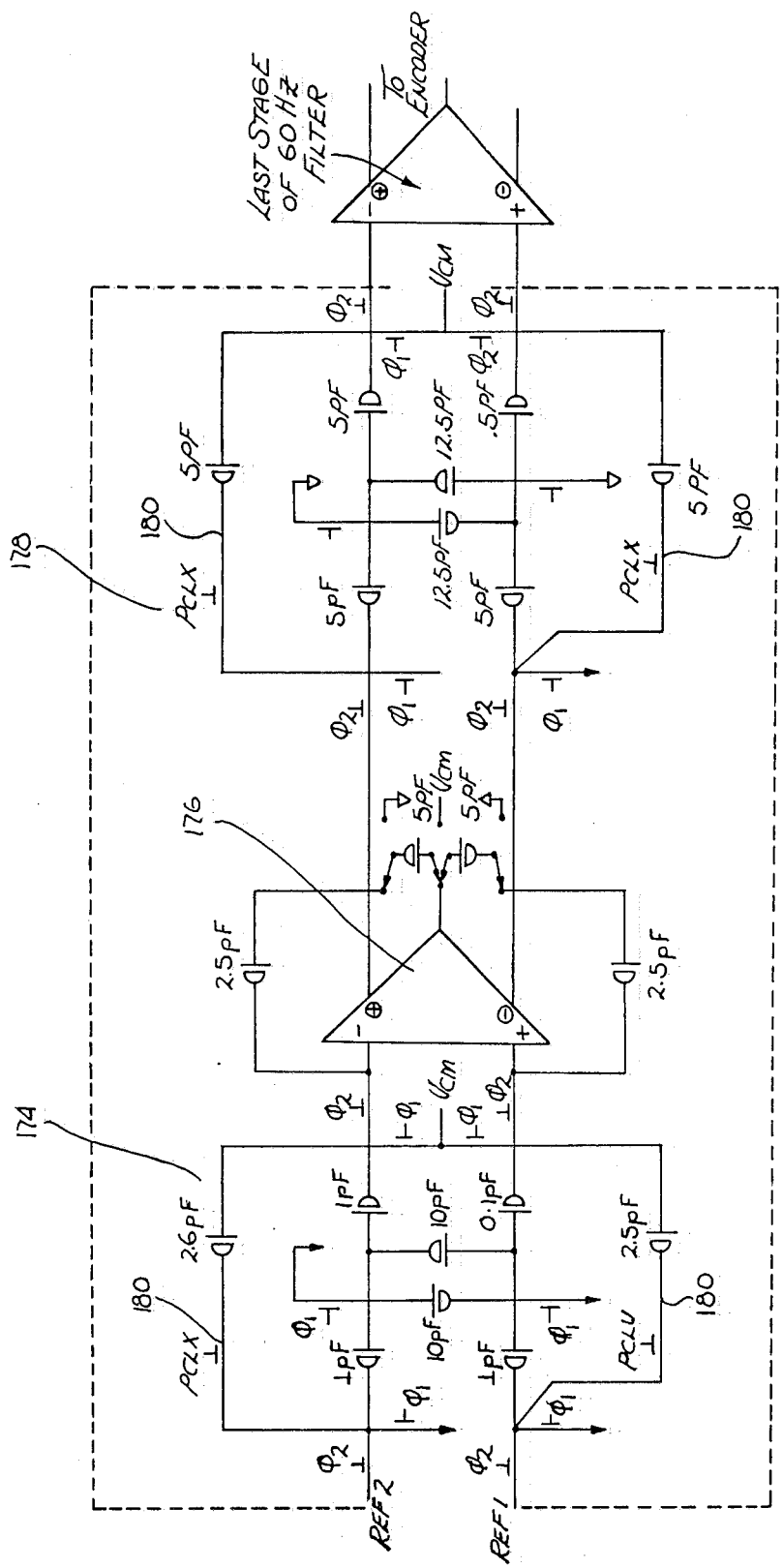
FIG. 9 is a schematic showing the auto-zero network.

Highpass section 88 also includes an auto-zero correction circuit 90 shown in greater detail in FIG. 9. Correction circuit 90 cancels any on-chip DC offset existing in the filter or encoder. The input to circuit 90 is the true sign bit information based upon the comparator output. As described in greater detail in connection with FIG. 9, auto-zero correction circuit 90 operates by successive attenuation of the signal and realization of large time constants. The output of highpass filter section 88 is coupled to a differential encoder of the type as described by Tsividis et. al., "UCB Thesis 1975", except that it is fully differential according to the present invention as described in greater detail in FIG. 11.

In FIG. 5, the receive side delivers a differential signal by using the same design concepts as in the various filter sections in the transmit side. The central portion of the receive side is a receive core section 96 sampled at 128 kHz. Circuit configuration of receive core section 96 is identical to transmit core section 86. Correction of end droop of the decoder is processed by a post filter power amplifier circuit 98 coupled to receive core section 96. Details of correction circuit 98 are shown and described in relation to FIG. 10. The common mode requirements of the output of amplifier 98 are stringent since the outputs are to be used in a single-ended configuration. Consider now the detailed circuit implementation for each of these filter sections in light of the above performance requirements.

FIG. 6 shows the circuit implementation of the anti-aliasing filter 84.

Anti-aliasing filter 84 is particularly characterized by a real pole which rises from passive section 90 and two complex conjugal poles which rise from two switched capacitor integrators as better shown in FIG. 6. Together, passive section 90 and prefilter 92 serve as an anti-aliasing circuit for transmit core section 86. Prefilter 92 is oversampled at the rate of 1.024 mHz. Aliasing refers generally to a phenomena observed in all sampled circuitry by which low frequency signals due to the non-audible sampling frequencies are generated into the audible range. As shown in FIG. 6, passive section 90 is comprised of a passive resistor 146 shunted to ground by capacitor 148. The output of passive section 90 is coupled to the switched capacitor input 150 associated with first switched capacitor integrator 152. Switched capacitor integrator 152 is associated with a plurality of differential signal and common mode signal switched capacitor feedbacks and a switched capacitor common mode feedback which are shown in FIG. 6 but shall not be described in detail here since they are implemented in a manner well-known to the art according to the differential teaching of the invention. The output of switched capacitor integrator 152 is coupled to the switched capacitor input 154 of a second switched capacitor 156. Again, switched capacitor 156 is associated with a plurality of switched capacitor differential signal and common mode signal feedbacks which are shown in FIG. 6 but will not be described here in detail.

The unique feature of anti-aliasing filter 84 as shown in FIG. 6 is the cascaded anti-aliasing elements which operate in the differential mode to anti-alias transmit core section 86 which in turn is sampled at 124 kHz. Since the aliasing phenomena is a given fact which cannot be avoided wherever sampled circuits are used, section 84 deals with the aliasing problem by attenuating all those higher frequency signals which would otherwise serve as a source for an aliasing signal in the audio range.

Thus, passive section 90 is chosen so that it serves as a lowpass filter to attenuate all signals near 1.024 mHz and above. The prefilter as a whole has a passband edge at approximately 32 kHz to avoid aliasing frequencies at or near 128 kHz at which transmit core section 86 is sampled. The passband edge of transmit core section 86 is approximately 3.4 kHz thereby avoiding any aliasing effect from the 8 kHz sample great in highpass section 88. Because the sampling rate of prefilter 92 is taken at such a high frequency, passive section 90 can easily serve to attenuate any aliasing introduced by the prefilter sampling rate. Similarly, the band edges of anti-aliasing section 86 as a whole and transmit core section 86 by cascading avoid any introduction of subsequent, lower sampling frequencies employed in the following stages.

Figure 7:
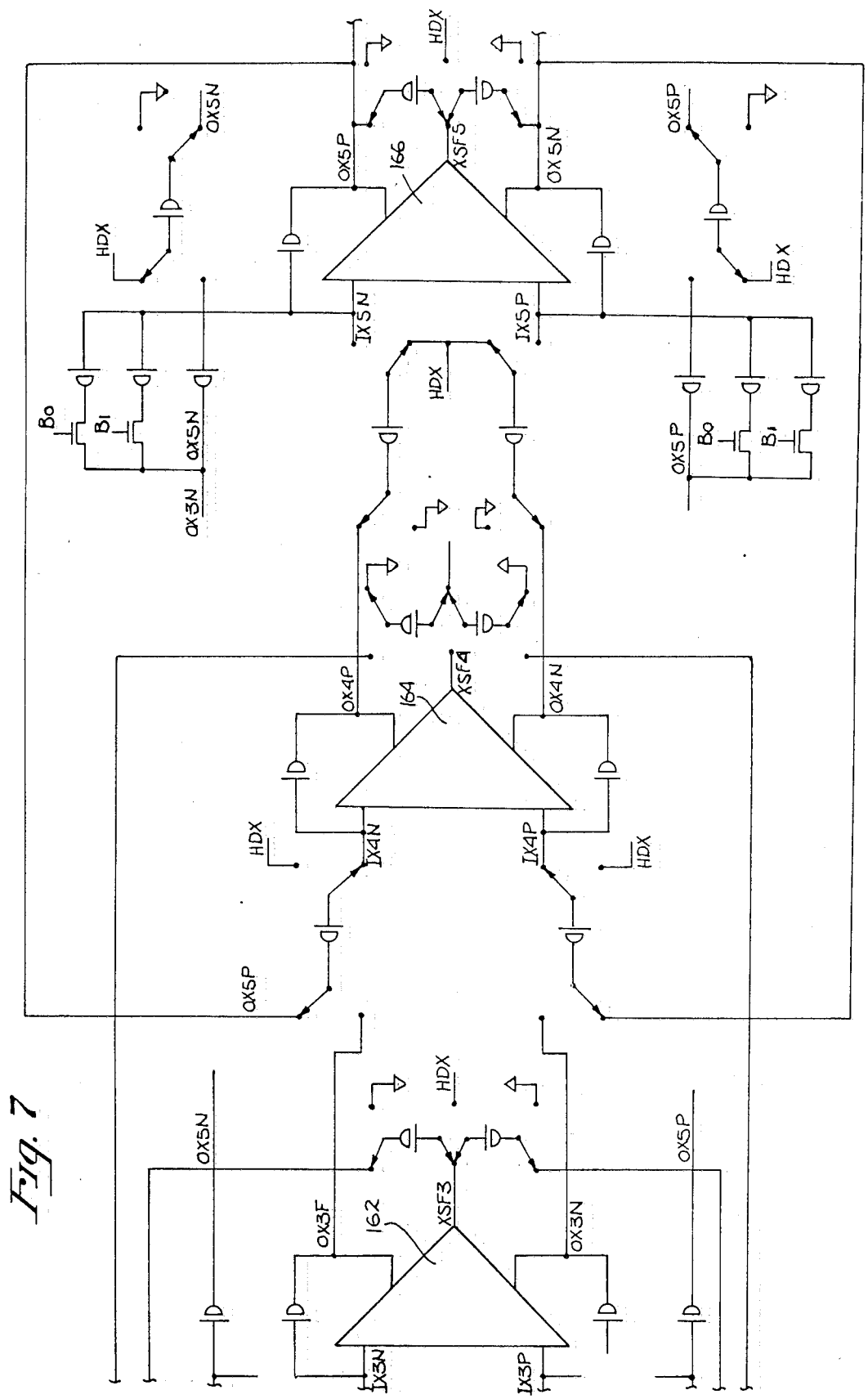
FIG. 7 is a detailed schematic showing the circuit structure of the transmit core filter section.

FIG. 7 shows the transmit core section 86 in greater detail. It can be readily seen that transmit core section 86 is comprised of five switched capacitor integrators, 158-166. The filter of FIG. 7 is a fifth order elliptic lowpass filter which uses two phase LDI clocking which was chosen to reduce the count of switched capacitors as compared to the number which would be required if a bi-linear transform integrator was employed. The relevancy of FIG. 7 is to illustrate the differential signal path which is carried through both the transmit side and receive side of the filter encoder/decoder combination. Unlike single ended filter circuits, signals of both plurality, V+ and V−, are readily available in the differential output amplifiers. Taking advantage of this property, it has been possible to reduce the count of switched capacitors on each side. The transmission zeroes were realized simply by considering the proper phase inversion required at any stage. Again, the switched capacitor network will not be described in detail beyond that given inasmuch as its implementation is specifically shown in FIG. 7 and would be easy to implement with the above teachings. As stated before, the passband of transmit core section 86 has a band edge at approximately 3.4 kHz with −33 dB attenuation at 4.6 kHz and higher.

Figure 8:
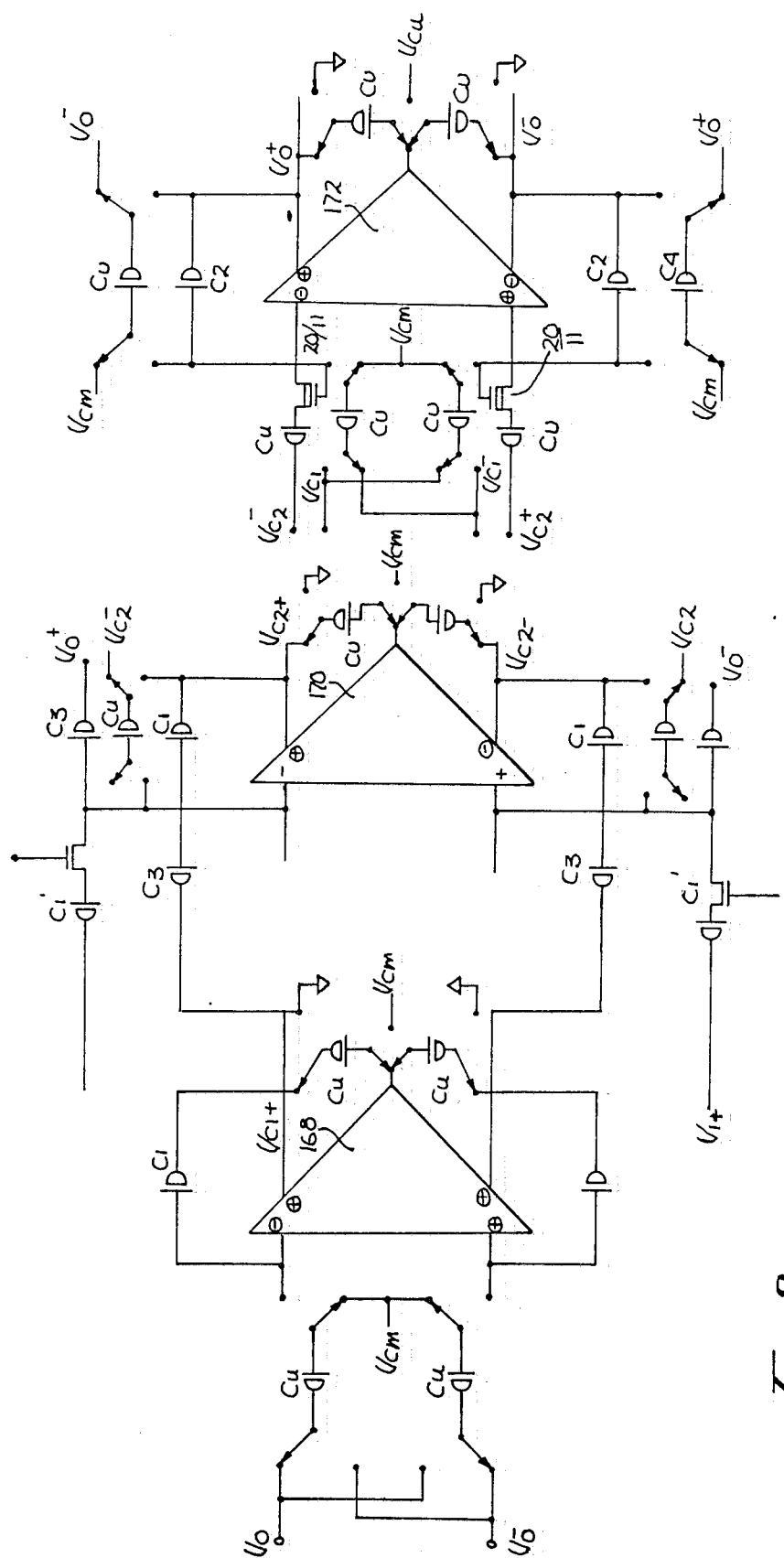
FIG. 8 is a schematic showing the circuit structure of the 60 Hz highpass filter section.

60 Hz highpass filter section 88 is coupled to the output of transmit core section 86 and is particularly illustrated in FIG. 8. Again, each of the switched capacitor integrators 168-172 has a construction very similar to that shown and described in connection with FIG. 1. The switched capacitors of this section are sampled at 8 kHz since the preceeding section, transmit core section 86, cuts off at 3.4 kHz. Again, the relevant point of the circuitry of FIG. 8 is the illustration of the switched capacitor integrator differential circuit scheme. The input and output feedback switched capacitors, although shown, again will not be described in detail. Once given the purpose of the highpass filter section as taught herein in the circuit structure shown in FIG. 6, it would be clear to one with ordinary skill what values to choose for the capacitors to achieve that result.

FIG. 9 shows the detailed circuitry of auto-zero network 90. Network 90 takes two reference voltages, $RF_1$ and $RF_2$ and clocks those voltages through a capacitive voltage divider 174 to the input of a switched capacitor integrator 176. The output of integrator 176 in turn is coupled to a similar capacitive voltage divider 178. The output of capacitive divider 178 is then coupled to the last stage of 60 Hz filter 88. Auto-zero network 90 serves as an integrator with a very long time constant, typically in the order of several seconds. A sign bit is used internally in encoder 89 and represents the true value of the assigned bit. Typically, the sign of the digital number generated by encoder 89 will change rapidly. For this reason, the most significant bit of the eight bit byte use a pseudosign bit which is inserted into the most significant bit as the mode for a unit time of the true sign bit. Input to capacitive voltage divider 174 is based upon the comparator output in the encoder 89 so that a differential reference voltage with the proper polarity is fed into auto-zero network 90. Capacitive voltage 174 is an attenuator with an attenuation factor of 40. The attenuation signal is integrated by switched capacitor integrator 176 with a time constant of approximately 31.25 ms. Next, the attenuated signal is again attentuated by a factor of 10 by virtue of capacitative voltage divider 178 and integrated by the following switched capacitor integrator to which it is coupled in highpass filter 88 with a time constant of approximately 1.78 ms. In the normal mode, the step size at the output of transmit core filter section 86 due to auto-zero circuit 90 is 3.5 mv for every 3.125 ms. This works out to be less than one quarter of the least significant bit of offset error during operation circuit.

During power up, it is desirable make a coarse adjustment in the DC offset on chip. This is done in auto-zero network 90 during the first 40 clock cycles after the circuit is powered up by a signal denoted PCLX which is applied in each of capacitive voltage dividers 174 and 178. The effect of application of signal code PCLX, at devices 180 allows for smaller time constants to be used in the feedback path. Thus, the DC offset is corrected to within a few millivolts while PCLX is high. After that time, normal cycles of auto-zero network 90 take over and PCLX goes low.

Anti-aliasing filter 84, in addition to passive section 90 and prefilter 92, includes a low noise amplifier 94. Amplifier 94 finds its primary application as an uncommitted operational amplifier that can be used for gain setting, line balancing and so forth. As a consequence, the inputs and outputs have to be available to the user. A differential structure would not be attractive because of the extra associated circuitry. From the user's standpoint, the specifications should be approximately the same as those found in any general purpose operational amplifier with respect to voltage gain, bandwidth noise, offset and the like. This is difficult to achieve in inloss circuitry which is particularly characterized by low voltage gains. The typical, prior art operational amplifier configuration was comprised of a cascade of a differential amplifier of transconductance $GM_1$ followed by an integrative stage of a DC gain of 82 and a unity gain buffer. The DC gain is given by:

$$A_{DC} = Gm_1 R_1 A_2 \text{ where } R_L = \text{load},$$
$$Gm_1 = \text{transconductance}$$

The general previously used solution was to precede the transconductance stage with a preamplifier gain $A_1$, thereby modifying DC gain to:

$$A^1{}_{DC} = (A_1 Gm_1) R_L A_2$$

The equation above can be associated mathematically to read:

$$A^1{}_{DC} = Gm_1 (A_1 R_L) A_2$$

FIG. 11 shows the circuit for the low noise amplifier which implements the above equation. The differential inputs 134 coupled to the gates of transconductance devices 136. The outputs of devices 136 are coupled to the differential input of operational amplifier 138 which has gain $A_1$. The output of amplifier 138 is coupled to the gates of depletion devices 140. Output is then taken to a voltage amplifier 142 of gain $A_2$. Thus, high gain can be achieved without increasing the value of capacitor 144 which would otherwise be necessary to preserve the band with instability but for the inclusion of operational amplifier 138 at the outputs of transconductance 136. Therefore, instead of preceding transconductance devices 136 by a preamplifier of gain $A_1$, the last equation above can be implemented to achieve a high gain, low noise circuit in NMOS technology without sacrifice of stability of band width.

Figure 10A:
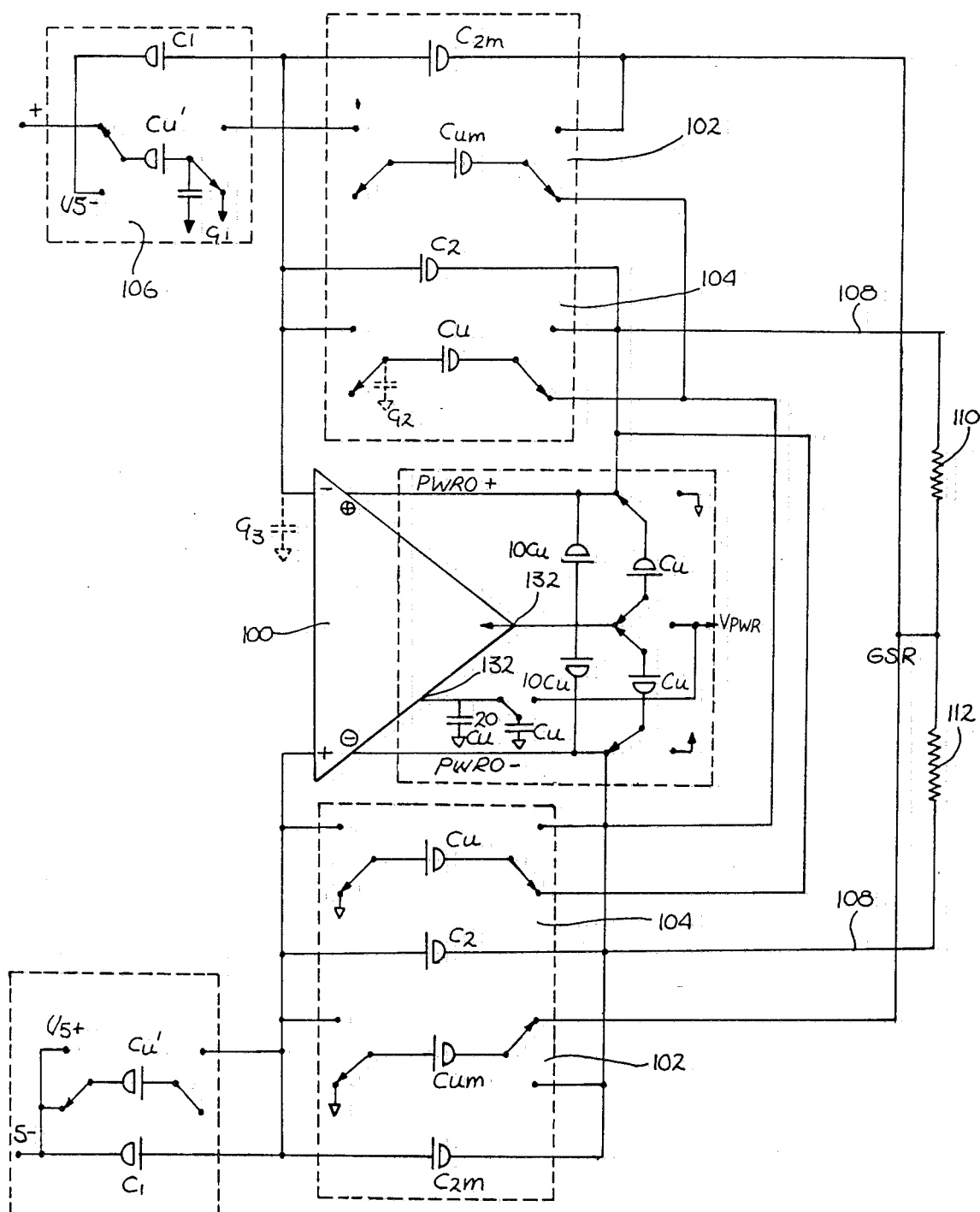
FIG. 10a is a schematic showing the power amplifier, sin X over X correction, and gain setting capability.
Figure 20B:
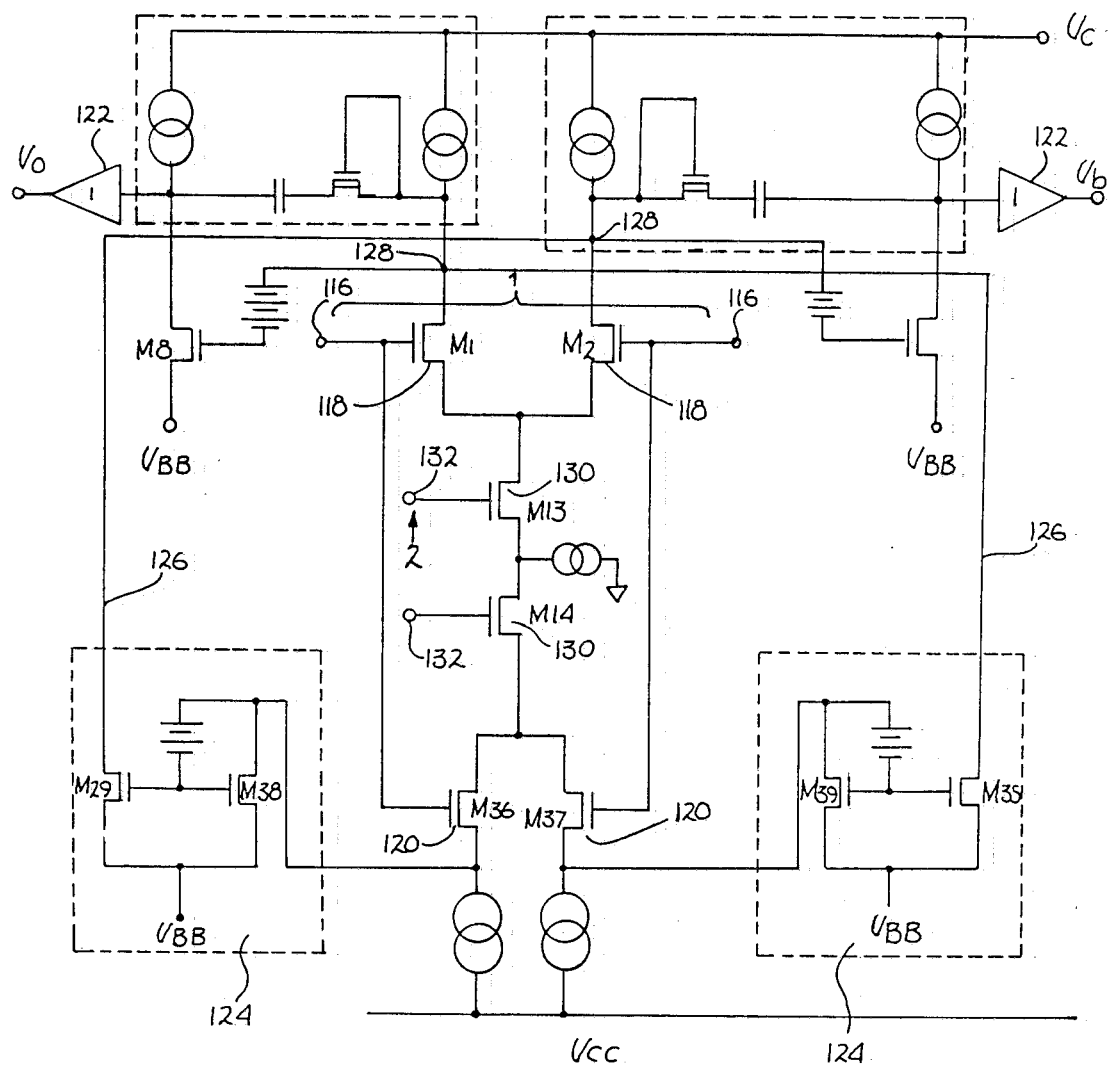

FIG. 10 illustrates the detail of circuit implementation for power amplification correction circuit 98. The operation of the power amplifier is based on an operational amplifier 100 described in greater detail in FIG. 10B. Amplifier 100 is associated with a number of switched capacitor groups. The first group is switched capacitors 102 which are used to form part of the gain setting circuit of the power amplifier shown as a whole in FIG. 10a. Gain setting switched capacitors 102 are shown on both sides of the balanced output of amplifier 100. Capacitor group 104 forms part of the frequency setting circuit while switched capacitor group 106 are the input switched capacitors to amplifier 100. The outputs 108 from amplifier 100 are coupled together by a two resistor network comprised of resistors 110 and 112.

Analysis of the circuit in FIG. 10a would show that power amplification circuit 98 is particularly characterized by having buffer outputs capable of driving a 600 ohm, 100 pF load differentially or a 300 ohm, 200 pF load single ended. With a minimum of off chip pairs, namely three, two discrete resistors can be externally used to continuously vary the gain in a matter which does not affect the frequency response of the circuit. In addition, the frequency response of the circuit is particularly tailored to correct the sin X over X distortion which is inserted by all sampled encoders and decoders.

Resistors 110 and 112 are connected in a differential voltage divider configuration. The voltage developed across resistor 112 is rated by capacitors CnM and $C_2M$ in the upper group of switched capacitors 102. This weighted voltage is then added to the portion defined by the frequency setting group 104, Cu and $C_2$ to set the total amount of feedback. It can be seen by inspection that the maximum gain condition will be for resistor 110 to be non-zero with resistor 112 zero. Similarly, the minimum is for resistor 110 to be zero and resistor 112 to be non-zero. In order for the frequency response of power amplifier 98 to be independent of the ratio of resistors 110 and 112, the capacitances Cu, $C_2$, Cum, and $C_2m$ are chosen to satisfy the following ratio:

$$\frac{Cu}{Cum} = \frac{C_2}{C_2m}$$

Common mode feedback is also implemented dynamically through switched capacitor 114. The positive input of the common mode operation of amplifier 100 is referred to a bias point which is decoupled from the power supply by a passive switched capacitor filter which limits the amount of noise transferred from this power supply to the outputs.

Special requirements are imposed upon operational amplifier 100 which are not required of the amplifier illustrated in connection with FIG. 1. For example, the outputs of amplifier 100 must be buffered to drive 300 ohms each in the performance of the common mode operation, the amplifier has to be comparable to the differential mode of operation for those users interested in extracting a single ended output. Finally, the compliance of the differential input has to be large enough to handle the common mode signal introduced by the gain setting network in the maximum gain configuration. FIG. 10b illustrates in simplified form the schematic of power amplifier 100. The circuit of FIG. 10b is uniquely characterized by two similar signal paths, a differential signal path and a common mode signal path. The voltage gain and band width performance of the amplifier is essentially the same with respect to both signal paths. The differential input 116 is coupled in parallel to the gates of devices 118 and 120. The differential output from devices 118 is coupled through a compensating network to output buffers 122 which are class AB push pull amplifiers chosen for minimum quiescent power. The differential output of devices 120 is coupled through current mirrors 124 and coupled through lines 126 to the appropriate nodes 128 and the differential output path.

The common mode input is coupled to the gates of devices 130. As illustrated in FIG. 10b, devices 130 are coupled in series between the first differential stage comprised of devices 118 and the second differential stage 120. Differential stages 118 and 120 are in each case balanced and parallel. A differential signal applied to common mode inputs 132 cause the output from the amplifier VO+ and VO− to move in the same direction whereas a differential input to the inputs 116 will cause the differential outputs to move in the opposite directions or in a differential manner. Common mode inputs 132 are also shown in FIG. 10 as the input points to amplifier 100 from the common mode biasing circuitry 113.

FIG. 12 shows the differential signal path continued through encoder 89. The differential output from highpass filter 88 is coupled to input 182. One input is coupled to a binary weighted positive capacitor array 184 while the other input is coupled to a binary weighted negative capacitor array 186. The output of each capacitor array is coupled to the differential inputs of comparator 188. Comparator 188 in turn is coupled to decision logic 190 which is comprised of random logic elements used to switch in either positive or negative capacitors in arrays 184 and 186. Thus, the analog signals present in inputs 182 represented through arrays 184 and 186 to comparator 188. A positive or negative comparator signal will be generated and processed by decision logic 190. The digital number is generated from the analog output by halving. In other words, decision logic 190 first looks to see whether the analog signal is above zero or below zero. If it is above zero, it then switches in the appropriate capacitors in array 184, which are merely a parallel array of switched capacitors, to determine whether the analog signal is above one quarter or below one quarter. Again, a differential signal will be generated at the output of comparator 188 depending on whether the signal is above or below one half. If the signal is above one half, decision logic circuitry 190 continues the cycling by determining whether or not the signal is above or below three quarters and so forth. Ultimately, an 8 bit word is generated which is the digital representation of the analog input signal. When cycling is completed, decision logic 190 transfers the digital word to the chip output 192. The unique feature of the encoder as illustrated in FIG. 12 is that the differential scheme is continued through each of the filter sections and into encoder 89 in the manner just described.

Without a detailed consideration, the use of chip area to implement the circuits shown in FIGS. 1–10 would be excessive and unacceptable. Chip area minimization has been achieved in the invention by a stack and unit device concept. The objective of the concept is to limit the amount of metal lines running over field regions. Since, in principle, metal is electrically isolated from the rest of the layers unless contact windows arbitrarily open, it is usually advantageous to run metal lines over diffusion of poly regions. Metal lines are layed out in a north-to-south direction with diffusion of poly regions layed out in a east and west direction. A constant width is chosen for the widest transistor and this defines a unit transistor. Therefore, transistors are packed onto the chip by stacking. In a local oxidation process it is well-known that capacitance at the boundary between diffusion and field region is large due to the field implant. Therefore, isolated diffusion regions should be avoided if possible. FIG. 11 illustrates the stack and unit device concept.

It is clear at this point that the number of capacitors used in both the transmit and receive sides of the present invention is large. The demands made on chip area are correspondingly large. FIG. 13 shows the stacked unit concept by which a maximum number of capacitive elements may be formed in a chip substrate.

Firstly, the entire circuit design is based upon the assumption of a unit length for each transistor. If a larger transistor is required in the unit transistor, then it is achieved by stacking links so that a multiple of unit links are combined. FIG. 13 shows a device having a unit link 182 for diffusion region 184. Polycrystalline silicon region 186 is shown as stacked by being connected by arm 188 and by traversing fusion region 184 twice. If a third link is required, polycrystalline silicon region 188 would again be serpentined across fusion region 184 to obtain a third multiple. Rather than choosing arbitrary circuitry parameters then, each of the circuit parameters of the devices shown in the preceeding figures are chosen based on the unit transistor width selected in FIG. 13. Polycrystalline regions run east and west and metal lines 188 run north and south. By using these design rules, the number of devices can be easily placed within a supplemental amount of chip area. For example, the core amplifier as shown in FIG. 1 can be fabricated in approximately $7.07 \times 10^{-4}$ mm$^2$; the power amplifier illustrated in FIG. 10a can be fabricated in $53.4 \times 10^{-4}$ mm$^2$; and the low noise amplifier as illustrated in FIG. 11 can be fabricated in $26.88 \times 10^{-4}$ mm$^2$.

Although the present invention has been described in connection with a specific filter and filter architecture, it must be understood that the invention can be modified by those having an ordinary skill in the art without departing from the spirit and scope. For example, although the illustrated embodiment is in terms of a voice band filter for use in analog-to-digital encoding and decoding, it must be understood that the differential technique taught here can be employed in any integrated circuit filter where the power supply rejection is required, good noise to dynamic range ratios are required, power dissipation must be minimized, and chip area minimized.

I claim:

1. A power amplifier circuit with a gain setting capability independent of frequency and having, a sin x/x distortion correction characteristic, where x is a function of time, comprising:
    a switched capacitor differential integrator having differential inputs and differential outputs;
    a first feedback network coupled between a positive input of said differential inputs and said outputs;
    said first network including a first capacitor having a value $C_u$, a second capacitor having a value $C_2$, a third capacitor having a value $C_{um}$ and a fourth capacitor having a value $C_{2m}$, said first and third capacitors being switched, said second and fourth capacitors being non-switched, said first and second capacitors for setting frequency response, said third and fourth capacitors for setting gain;
    a second network including a fifth capacitor having a value $C_u$, a sixth capacitor having a value $C_2$, a seventh capacitor having a value $C_{um}$ and an eighth capacitor having a value $C_{2m}$, said fifth and seventh capacitors being switched, and said sixth and eighth capacitors being non-switched, said fifth and sixth capacitors for setting frequency response, said seventh and eighth capacitors for setting gain;
    wherein gain can be arbitrarily set by two resistors coupled between a common mode terminal and said differential outputs, and wherein gain setting will not affect the frequency response of said amplifier circuit provided that:

$$C_u/C_{um} = C_2/C_{2m}$$

2. The amplifier circuit of claim 1 wherein said integrator includes an internal differential signal path and a common mode signal path.

3. The amplifier circuit of claim 2 wherein said integrator further includes a,
    first and second differential amplifiers having parallel inputs, outputs of said second differential amplifier being coupled through current mirrors to add to the outputs of said first differential amplifier;
    two output buffers, one for each output of said first differential amplifier, said buffers also coupled to the outputs of said current mirrors; and
    a common mode input coupled in series between said first and second differential amplifiers.

* * * * *